(12) United States Patent
Mii et al.

(10) Patent No.: US 7,661,576 B2
(45) Date of Patent: Feb. 16, 2010

(54) WIRE BONDING METHOD

(75) Inventors: Tatsunari Mii, Tachikawa (JP); Shinichi Akiyama, Akiruno (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 12/283,383

(22) Filed: Sep. 10, 2008

(65) Prior Publication Data
US 2009/0308914 A1 Dec. 17, 2009

Related U.S. Application Data

(62) Division of application No. 10/879,566, filed on Jun. 28, 2004, now Pat. No. 7,458,498.

(30) Foreign Application Priority Data

Jun. 27, 2003 (JP) .............................. 2003-183918
Mar. 10, 2004 (JP) .............................. 2004-066541

(51) Int. Cl.
*B23K 31/02* (2006.01)

(52) U.S. Cl. .................................................. 228/180.5

(58) Field of Classification Search ........................ None
See application file for complete search history.

(56) References Cited

U.S. PATENT DOCUMENTS

| 5,967,401 | A | * | 10/1999 | Nishiura et al. | .......... 228/180.5 |
| 6,343,733 | B1 | * | 2/2002 | Nishiura et al. | .......... 228/180.5 |
| 7,014,095 | B2 | * | 3/2006 | Mochida | .................. 228/180.5 |
| 2005/0072833 | A1 | * | 4/2005 | Wong et al. | ............... 228/180.5 |
| 2005/0202621 | A1 | * | 9/2005 | Wong et al. | .................. 438/200 |

FOREIGN PATENT DOCUMENTS

JP 10-189641 7/1998

* cited by examiner

*Primary Examiner*—Kiley Stoner
(74) *Attorney, Agent, or Firm*—William L. Androlia; H. Henry Koda

(57) ABSTRACT

A wire bonding method that connects a first bonding point and a second bonding point by a wire, the method including a step that press-bonds a ball formed on a tip end of a wire to a first bonding point, thus forming a press-bonded ball; a step that slightly raises a capillary, moves the capillary toward a second bonding point and then lowers the capillary by an amount that is smaller than an amount in which the capillary was raised, and a step that raises the capillary to allow the wire to be paid out of the capillary and moves the capillary toward a second bonding point, thus connecting the wire to the second bonding point.

1 Claim, 2 Drawing Sheets

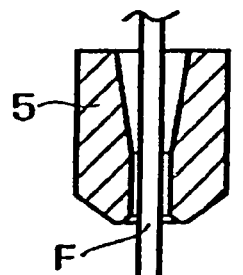
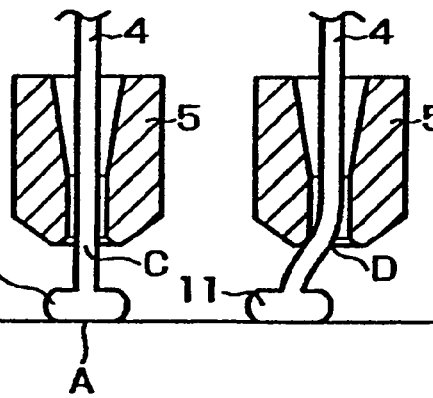
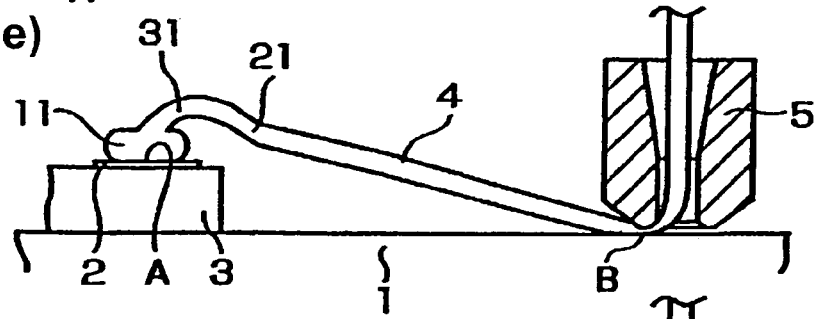
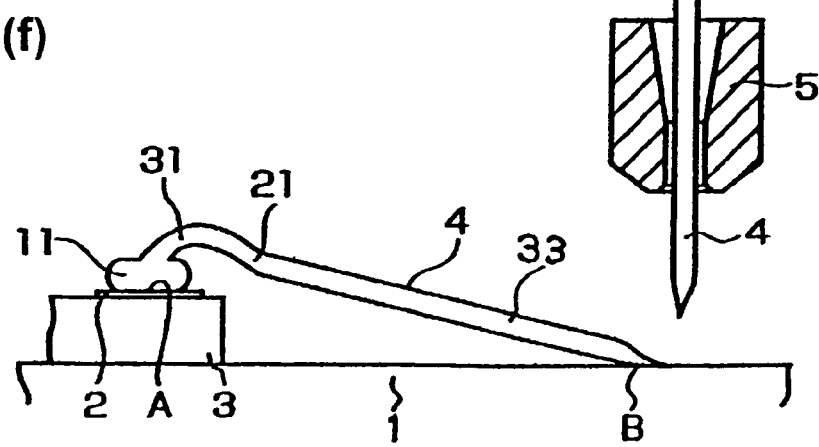

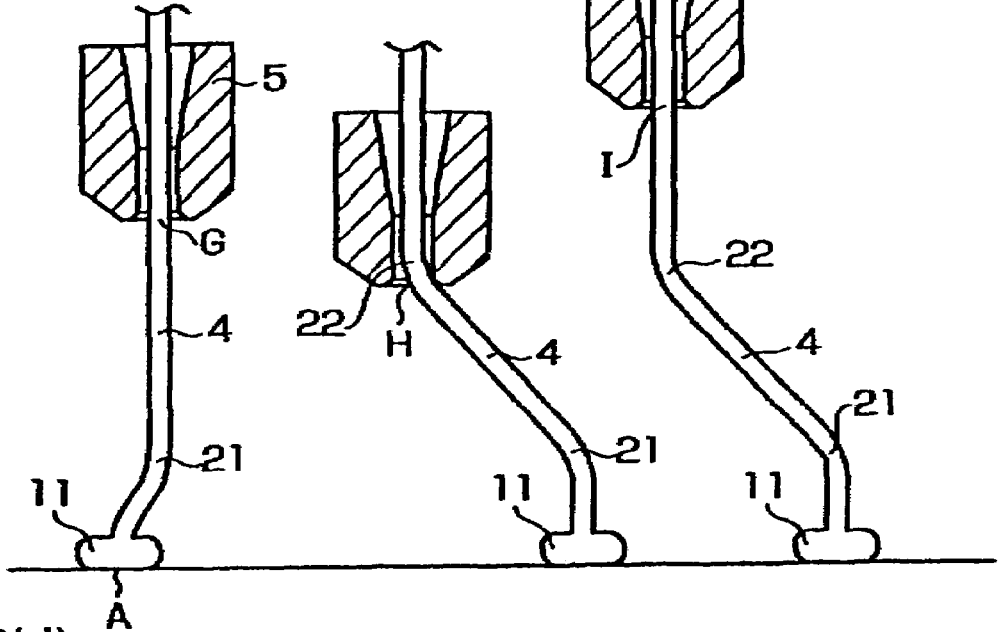
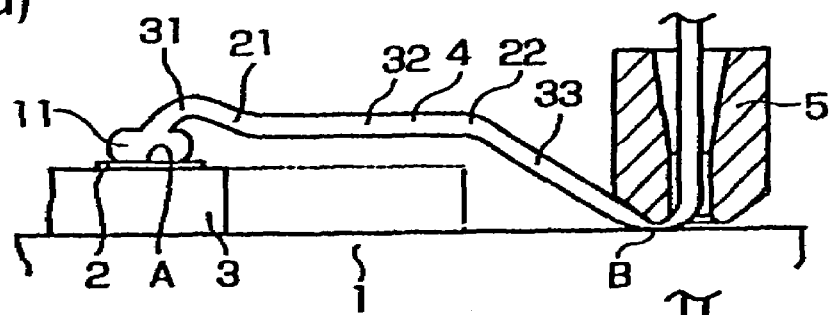
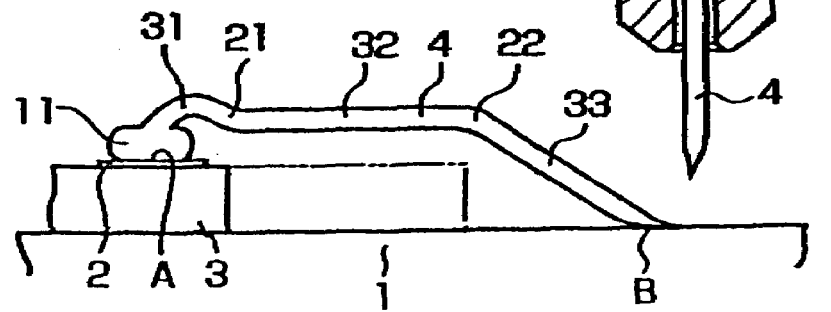

WIRE BONDING METHOD

This application is a divisional of 10/879,566 filed Jun. 28, 2004, now U.S. Pat. No. 7,458,498 B2.

BACKGROUND OF THE INVENTION

1. Field of the Invention

The present invention relates to a semiconductor device and a wire bonding method in which a first bonding point and second bonding point are connected by a wire and more particularly to a semiconductor device that has a low wire loop shape and to a method for manufacturing such a semiconductor device.

2. Prior Art

In wire bonding, when slack occurs in a wire that connects a first bonding point and a second bonding point, the wire contacts the die that causes short-circuiting. Conventionally, in order to prevent this, a press-bonded ball is first formed by press-bonding a ball to the first bonding point, then a neck height portion that extends upward is formed on the press-bonded ball, and a bent portion (kink) is formed at the upper end of this neck height portion. This method is disclosed in, for example, Japanese Patent Application Laid-Open (Kokai) No. H10-18964.

In methods of the prior art, since a neck height portion is formed on the press-bonded ball, the resulting wire loop is inevitably high. In recent years, though there are strong demands that semiconductor devices be made smaller and thinner, with prior art methods, such demands are not sufficiently satisfied.

SUMMARY OF THE INVENTION

Accordingly, the object of the present invention is to provide a semiconductor device and a wire bonding method that form a low wire loop.

The above object is accomplished by a unique structure of the present invention for a semiconductor device in which a first bonding point and a second bonding point are connected by a wire loop, and in the present invention, the wire loop is comprised of:
  a circular arc portion that extends in a shape of a circular arc from the first bonding point,
  an inclined portion that extends to the second bonding point from the circular arc portion, and
  a bent portion formed between the circular arc portion and the inclined portion.

The above object is accomplished by another unique structure of the present invention for a semiconductor device in which a first bonding point and a second bonding point are connected by a wire loop, and in the present invention, the wire loop is comprised of:
  a circular arc portion that extends in a shape of a circular arc from the first bonding point,
  a horizontal portion that extends horizontally from the circular arc portion,
  an inclined portion that extends to the second bonding point from the horizontal portion, and
  bent portions respectively formed between the circular arc portion and the horizontal portion and between the horizontal portion and the inclined portion.

The above object is accomplished by a series of unique steps of the present invention for a wire bonding method that connects a first bonding point and a second bonding point by a wire, and in the present invention, the method comprises sequentially:
  a step that press-bonds a ball formed on a tip end of a wire to a first bonding point, thus forming a press-bonded ball,
  a step that slightly raises a capillary, moves the capillary toward a second bonding point, and then lowers the capillary by an amount that is smaller than an amount in which the capillary was raised, and
  a step that raises the capillary to allow the wire to be paid out of the capillary and moves the capillary toward a second bonding point, thus connecting the wire to the second bonding point.

The above object is accomplished by another series of unique steps of the present invention for a wire bonding method that connects a first bonding point and a second bonding point by a wire, and in the present invention, the method comprises sequentially:
  a step that press-bonds a ball formed on a tip end of a wire to a first bonding point, thus forming a press-bonded ball,
  a step that slightly raises a capillary, moves the capillary toward a second bonding point, and then lowers the capillary by an amount that is smaller than an amount in which the capillary was raised,
  a step that raises the capillary and then performs at least once a reverse operation in which the capillary is moved in a direction opposite from the second bonding point, and
  a step that raises the capillary to allow the wire to be paid out of the capillary and moves the capillary toward the second bonding point, thus connecting the wire to the second bonding point.

Since the portion of the wire that extends from the first bonding point is a circular arc portion, the height of this circular arc portion is lower than that of a conventional neck height portion. Accordingly, in the present invention, an extremely low wire loop is formed. Furthermore, since a bent portion is formed between the circular arc portion and the inclined portion, no slack occurs in the wire that is connected between the first bonding point and the second bonding point.

BRIEF DESCRIPTION OF THE DRAWINGS

FIGS. 1(a) through 1(f) show the steps of the first embodiment of the wire bonding method of the present invention; and FIGS. 2(a) through 2(e) show the steps of the second embodiment of the wire bonding method of the present invention, the step of FIG. 2(a) following the step of FIG. 1(c).

DETAILED DESCRIPTION OF THE INVENTION

A first embodiment of the semiconductor device of the present invention will be described with reference to FIG. 1(f).

The wire loop (or the wire loop shape) in which the first bonding point A and second bonding point B are connected by a wire 4 includes a circular arc portion 31, which extends in the shape of a circular arc from the first bonding point A, and an inclined portion 33, which extends from this circular arc portion 31 to the second bonding point B. A bent portion 21 is formed between the circular arc portion 31 and the inclined portion 33.

Since the portion of the wire that extends from the first bonding point A is thus a circular arc portion 31, the height of the circular arc portion 31 is lower than that of a conventional neck height portion. Thus, the wire loop is extremely low. Since the bent portion 21 is formed between the circular arc portion 31 and the inclined portion 33, no slack occurs in the wire 4 that is connected between the first bonding point A and second bonding point B.

Next, a first embodiment of the wire bonding method of the present invention that is used to obtain a semiconductor device such as that shown in FIG. 1(f) will be described with reference to FIG. 1.

As shown in FIG. 1(f), a die 3 on which an electrode pad 2 is formed is mounted on a circuit board 1 consisting of a lead frame or a board such as a ceramic substrate or printed board, etc. A first bonding point A on such an electrode pad 2 and second bonding point B such as wiring or a lead on the circuit board 1 are electrically connected by a wire 4.

First, as shown in FIG. 1(a), with a damper (not shown in the drawings) that holds the wire 4 in an open state, a capillary 5 is lowered so that a ball formed on the tip end of the wire 4 is bonded to the first bonding point A, thus forming a press-bonded ball 11.

The capillary 5 is then slightly raised to point C, and the wire 4 is paid out of the capillary 5.

Next, as shown in FIG. 1(b), the capillary 5 is moved horizontally to point D in the direction of the second bonding point B.

Then, as shown in FIG. 1(c), the capillary is lowered to point E by an amount that is smaller than the amount of the above-described raising. As a result of the step shown in this FIG. 1(c), a strong bent portion 21 is formed in the portion of the wire that is located slightly above the press-bonded ball 11.

Next, as shown in FIG. 1(d), the capillary 5 is raised to point F by an amount that corresponds to the length of wire that is to be connected between the first bonding point A and the second bonding point B, and the wire 4 is paid out of the capillary 5.

Afterward, an operation that is the same as that performed in a conventional method is performed. More specifically, as shown in FIG. 1(e), the capillary 5 is caused to make a circular arc motion or is caused to make a circular arc motion and is then lowered, so that the capillary 5 is positioned at the second bonding point B, and the wire 4 is bonded to the second bonding point B.

Next, the clamper (not shown in the drawings) and the capillary 5 are both raised, and the clamper is closed at an intermediate point during this raising movement, so that the wire 4 is cut from the root portion of the second bonding point B as shown in FIG. 1(f). As a result, the first bonding point A and second bonding point B are electrically connected.

Conventionally, a bent portion is formed by performing a reverse operation on a portion of the wire 4 located above the press-bonded ball 11. Accordingly, a neck height portion that rises upward from the press-bonded ball 11 is formed. However, in the shown embodiment, the capillary 5 is moved toward the second bonding point B as shown in FIG. 1(b), and the capillary 5 is then lowered so that a bent portion 21 is formed as shown in FIG. 1(c). Accordingly, the bending direction of the bent portion 21 is the opposite of that in a conventional method. Consequently, when the capillary 5 is moved to a point above the second bonding point B as shown in FIGS. 1(d) through 1(e), the portion of the wire between the press-bonded ball 11 and the bent portion 21 forms a circular arc portion 31, and the height of this circular arc portion is lower than that of a conventional neck height portion, and the wire loop is extremely low. Furthermore, since the bent portion 21 is formed by lowering the capillary 5 as shown in FIG. 1(c), a strong bent portion 21 is formed, and no slack occurs in the wire 4 that is connected between the first bonding point A and second bonding point B.

A second embodiment of the semiconductor device of the present invention will be described with reference to FIG. 2(e).

Here, the wire loop (or the shape of the wire loop) in which the first bonding point A and second bonding point B are connected by a wire 4 includes a circular arc portion 31 that extends from the first bonding point A, a horizontal portion 32 that extends horizontally from this circular arc portion 31, and an inclined portion that extends to the second bonding point B from this horizontal portion 32. Bent portions 21 and 22 are respectively formed between the circular arc portion 31 and the horizontal portion 32 and between the horizontal portion 32 and the inclined portion 33.

In addition to the advantages of the above-described embodiment, the second embodiment also provides advantages. Especially, since the bent portion 22 is formed at an intermediate point of the wire loop, the portion of the wire between the bent portion 21 and the bent portion 22 is a substantially horizontal to be a horizontal portion 32. As a result of the existence of this horizontal portion 32, contact of the wire 4 with the die 3 is prevented even if, for example, the die 3 should extend as indicated by the two-dot chain line so that the distance between the first bonding point A and the end portion of the die 3 is long; Furthermore, sagging of the wire loop is reduced even in cases where the distance between the first bonding point A and the second bonding point B is long. Accordingly, such a horizontal portion 32 is effective.

Next, a second embodiment of the wire bonding method of the present invention that produces a semiconductor device such as that shown in FIG. 2(e) will be described with reference to FIGS. 2(a) through 2(e). The same reference numerals are assigned to members or portions that are the same as in FIGS. 1(a) through 1(f) or that correspond to members or portions in FIGS. 1(a) through 1(f), and a detailed description of such members or portions is omitted. In this embodiment, as seen from FIG. 2(e), a bent portion 22 is formed at an intermediate point on the wire 4.

First, a bent portion 21 is formed at a point located slightly above the press-bonded ball 11 by the steps shown in FIGS. 1(a) through 1(c).

Next, as shown in FIG. 2(a), the capillary 5 is raised to point G by an amount that corresponds to the length of the horizontal portion 32 shown in FIG. 2(e).

Then, as shown in FIG. 2(b), a reverse operation is performed in which the capillary 5 is moved in a circular arc to point H in the opposite direction from the second bonding point B and is lowered. As a result, the wire 4 is placed in an inclined state, and a bent portion 22 is formed.

Next, as shown in FIG. 2(c), the capillary 5 is raised to point I by an amount that corresponds to the length of the inclined portion 33 shown in FIG. 2(e). Subsequently, the same operations as those shown in FIGS. 1(e) and 1(f) are performed, so that the wire 4 is bonded to the second bonding point B as shown in FIGS. 2(d) and 2(e).

In the above embodiment shown in FIG. 2, a single bent portion 22 is formed in the portion of the wire 4 located between the bent portion 21 and the second bonding point B. However, it is also possible to perform two or more reverse operations so that two or more bent portions are formed.

The invention claimed is:

1. A wire bonding method that connects a first bonding point and a second bonding point by a wire, said method comprising, in the order stated, steps of:
   a step that press-bonds a ball formed on a tip end of a wire to a first bonding point, thus forming a press-bonded ball; then
   a step that raises a capillary; then
   a step that moves the capillary toward a second bonding point; then
   a step that lowers the capillary by an amount that is smaller than an amount in which the capillary was raised to form a first bent portion in said wire; then
   a step that raises the capillary; then
   a step that then performs at least once a reverse operation in which the capillary is moved in a direction opposite from the second bonding point to form a second bent portion in said wire; then
   a step that raises the capillary to allow the wire to be paid out of the capillary; and then
   a step that moves the capillary toward the second bonding point, thus connecting the wire to the second bonding point.

* * * * *